United States Patent
Sutardja et al.

(10) Patent No.: US 8,116,110 B1
(45) Date of Patent: Feb. 14, 2012

(54) ARRAY ARCHITECTURE INCLUDING MIRRORED SEGMENTS FOR NONVOLATILE MEMORY DEVICE

(75) Inventors: Pantas Sutardja, Los Gatos, CA (US); Chih-Hsin Wang, San Jose, CA (US); Qiang Tang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 473 days.

(21) Appl. No.: 12/340,911

(22) Filed: Dec. 22, 2008

Related U.S. Application Data

(60) Provisional application No. 61/017,361, filed on Dec. 28, 2007.

(51) Int. Cl.
*G11C 5/06* (2006.01)
(52) U.S. Cl. .................... 365/63; 365/185.11
(58) Field of Classification Search .......... 365/63, 365/185.11, 185.12, 185.28
See application file for complete search history.

(56) References Cited

U.S. PATENT DOCUMENTS

| | | | |
|---|---|---|---|
| 6,310,805 B1 * | 10/2001 | Kasa et al. | ................ 365/200 |
| 2004/0004863 A1 * | 1/2004 | Wang | ........................ 365/199 |
| 2006/0023507 A1 * | 2/2006 | Mangan et al. | .......... 365/185.05 |

OTHER PUBLICATIONS

U.S. Appl. No. 12/209,794, filed Sep. 12, 2008; "Program-and-Erase Method for Multilevel Nonvolatile Memory"; Qiang Tang et al.; 78 pages.
U.S. Appl. No. 12/127,326, filed May 27, 2008; "Bit Line Decoder Architecture for Nor-Type Memory Array"; Pantas Sutardja; 86 pages.

* cited by examiner

*Primary Examiner* — Vu Le

(57) ABSTRACT

A memory device including nonvolatile memory cells arrayed in a first direction and in a second direction, a plurality of first lines extending in the first direction for coupling memory cells arrayed in the first direction, and a plurality of second lines extending in the second direction for coupling memory cells arrayed in the second direction. The memory device includes a plurality of decoders, including i) first decoders coupled to the first lines and ii) second decoders coupled to the second lines, for accessing any one or more of the memory cells in any order. The memory device includes a plurality of segments. Each segment includes different ones of the nonvolatile memory cells. A first one of the segments is juxtaposed to, in the second direction, a second one of the segments. The second one of the segments mirrors, in the second direction, the first one of the segments.

22 Claims, 7 Drawing Sheets

ARRAY ARCHITECTURE INCLUDING MIRRORED SEGMENTS FOR NONVOLATILE MEMORY DEVICE

CROSS-REFERENCED APPLICATIONS

This application claims the benefit under 35 USC 119(e) of Provisional Patent Application U.S. Ser. No. 61/017,361 entitled NONVOLATILE MEMORY DEVICE AND ARRAY ARCHITECTURE filed Dec. 28, 2007; Inventors: Pantas Sutardja et al. Application Ser. No. 61/017,361 is hereby incorporated by reference in its entirety in the present specification.

U.S. patent application Ser. No. 12/209,794 entitled PROGRAM-AND-ERASE METHOD FOR MULTILEVEL NONVOLATILE MEMORY, filed Sep. 12, 2008; Inventors Qiang Tang et al. application Ser. No. 12/209,794 is hereby incorporated by reference in its entirety in the present specification.

U.S. patent application Ser. No. 12/127,326 entitled BIT LINE DECODER ARCHITECTURE FOR NOR-TYPE MEMORY ARRAY, filed May 27, 2008; Inventor: Pantas Sutardja. application Ser. No. 12/127,326 is hereby incorporated by reference in its entirety in the present specification.

BACKGROUND OF THE INVENTION

This invention relates to memory devices and particularly to non-volatile memory arrays and array architectures.

Array architectures are critical for memory devices. Array architectures play a key role in determining the efficiency, power consumption, read/write speed, reliability and other attributes of memory devices.

Nonvolatile memories are formed by arrays of memory cells where each memory cell typically has four terminals and a body. Each cell includes a control gate accessed through a word line and includes a source, a drain and a channel there between. The source and the drain are accessed through bit lines. Each cell may include a tunneling gate accessed through a tunneling line. Each cell includes a charge storage region for storing charges where the charge storage region is typically a floating gate. A body terminal is typically in a substrate and is common to all the cells on the substrate.

Nonvolatile memories generally need improved speed of operation, greater reliability, greater flexibility in the functional operation and smaller sizes for increased storage capacities.

In consideration of the above background, there is a need for improved nonvolatile memory devices and architectures for nonvolatile memories.

SUMMARY

Embodiments in the specification include a memory device having a segmented architecture. The memory device is arranged with a plurality of nonvolatile memory cells arrayed in a first direction and in a second direction. A plurality of first lines extend in the first direction for coupling memory cells arrayed in the first direction. A plurality of second lines extend in the second direction for coupling memory cells arrayed in the second direction. A plurality of decoders include first decoders coupled to the first lines and second decoders coupled to the second lines for accessing any one or more of the memory cells in any order.

In an embodiment of the memory device, the order of accessing memory cells is non-linear.

In an embodiment of the memory device, the order of accessing memory cells is interleaved with an interleave interval where, for example, the interleave interval is $2^n$ where n is a positive integer.

In an embodiment of the memory device, the memory cells are organized in sectors having a sector size and the interleave interval is equal to or greater than the sector size.

In an embodiment, the memory device has a plurality of segments where each segment includes different ones of the nonvolatile memory cells and wherein a first one of the segments is juxtaposed, in the second direction, a second one of the segments and where, in one example, the second one of the segments mirrors, in the second direction, the first one of the segments.

In an embodiment of the memory device, a first group of the plurality of segments are in a first block with first ones of the first decoders on a first side of the first block; a second group of the plurality of segments are in a second block with second ones of the first decoders on a second side of the second block; and wherein the first group is juxtaposed the second group with the second group mirroring, in the first direction, the first group whereby the first ones of the first decoders are adjacent the second ones of the first decoders.

In embodiments of the memory device, the first lines include bit lines and tunneling lines and the first decoders include bit line decoders and tunneling line decoders and the second lines include word lines and the second decoders include word line decoders.

In an embodiment of the memory device, functional operations of the memory device target concurrently any one or more cells. In embodiments where the memory cells are organized in blocks, rows and sectors, the functional operations include one or more of block erase, row erase, sector erase, erase all and erase partial.

In an embodiment of the memory device, the functional operations target concurrently any one or more groups of cells or any one or more cells.

In embodiments of the memory device, the memory cells are organized in architectural levels including one or more of blocks, sectors, rows and pages.

In one embodiment, a memory device has a plurality of segments where each segment includes a plurality of nonvolatile memory cells arranged as an array with cells in rows in a first direction and with cells in columns in a second direction. One or more first bit lines extend in the first direction for coupling first ones of the memory cells arrayed in the first direction. One or more second bit lines extend in the first direction for coupling the first ones of the memory cells arrayed in the first direction. One or more tunneling lines couple the first ones of the memory cells arrayed in the first direction. One or more word lines extend in the second direction for coupling second ones of the plurality of the memory cells extending in the second direction. A first one of the segments of cells is juxtaposed a second one of the segments of cells in the second direction. The plurality of segments have tunneling line decoders coupled to the tunneling lines on a side in the first direction of the plurality of segments and include bit line decoders coupled to the bit lines on another side in the first direction of the plurality of segments. The segments have word line decoders coupled to the word lines.

In an embodiment, a second one of the segments mirrors, in the second direction, a first one of the segments.

In an embodiment, a first group of segments are in a first block with tunneling line decoders on a first side of the segments of the first group and with bit line decoders on a second side of the segments of the first group. Further, a second group of segments are in a second block with bit line decoders on a first side of the segments of the second group and with tunneling line decoders on a second side of the segments of the second group. With this architecture, the second group mirrors, in the first direction, the first group.

The architecture of the various embodiments provides improved speed of operation, greater reliability, and greater flexibility in the functional operation of the memory devices.

The foregoing and other objects, features and advantages of the invention will be apparent from the following detailed description in conjunction with the drawings.

DETAILED DESCRIPTION

Figure 1:
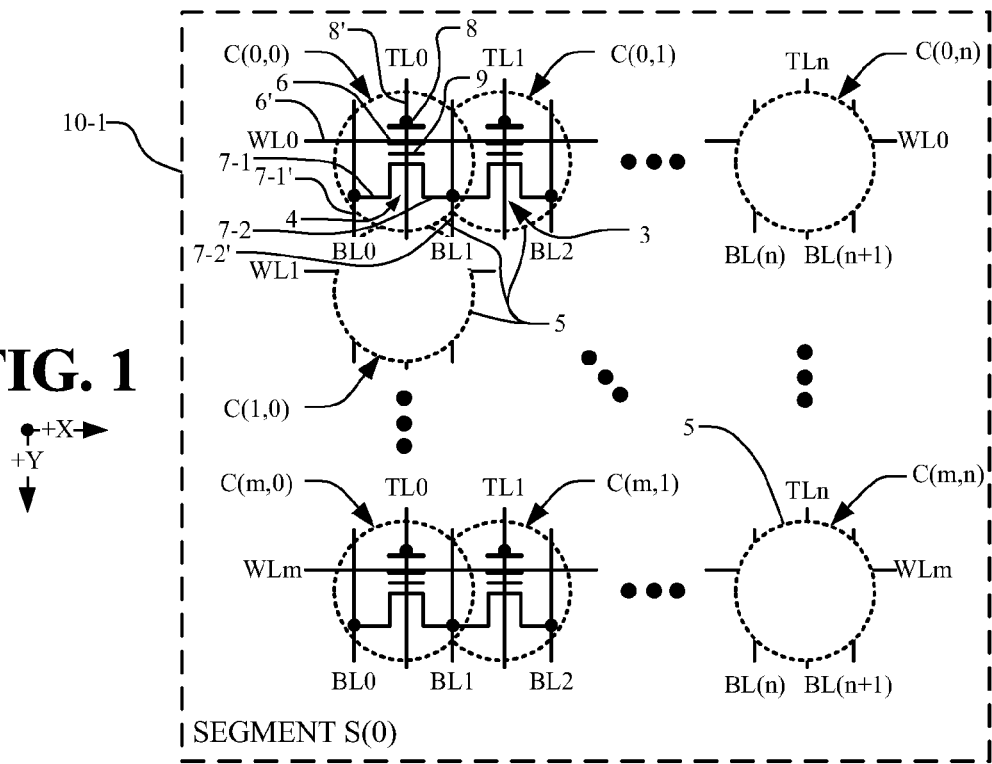
FIG. 1 depicts an (n+1)-by-(m+1) array of cells arranged as a segment having n X-axis cells and m Y-axis cells in a (+x,+y) orientation.

FIG. 1 depicts an (n+1)-by-(m+1) array of cells arranged as a segment 10-1 having n rows of X-axis cells 5 and m columns of Y-axis cells 5. The rows of cells 5 include cells C(0,0), C(0,1), . . . , C(0,n); cells C(1,0), C(1,1), . . . , C(1,n); and continuing to cells C(m,0), C(m,1), . . . , C(m,n) where not all cells are shown in FIG. 1. The segment 10-1 is defined to have a (+x,+y) orientation in that the cell column numbering starts with "0" and increases in the positive X-axis direction and the cell row numbering starts with "0" and increases in the positive Y-axis direction.

In FIG. 1, every cell 5 has four terminals and a body where the C(0,0) cell 5 is described as typical. In the C(0,0) cell, a control gate 6 is accessed through a first terminal coupled by the word line (WL0) 6'. A source 7-1 and a drain 7-2 are accessed through second and third terminals coupled by bit lines (BL0 and BL1) 7-1' and 7-2', respectively. A tunneling gate 8 is accessed through a fourth terminal coupled by tunneling line (TL0) 8'. A body terminal (not shown) is typically in a substrate (not shown) and is common to all the cells 5 in segment 10-1. Each cell 5 further includes a charge storage region for storing charges. In the cells 5 and as shown for the cell C(0,0) example, a floating gate 9 is the charge storage region.

In FIG. 1, each memory cell 5 includes the source 7-1 as a first element, the drain 7-2 as a second element and a channel 4 between the first element and the second element in a body 3. The charge storage region 9 is juxtaposed the channel 4, the control gate 6 is juxtaposed the charge storage region 9 and the tunneling gate 8 is juxtaposed the control gate 6.

In FIG. 1, each of the cells 5 in a row couples to the same word line. For example, the first row of cells, including cells C(0,0), C(0,1), . . . , C(0,n), all couple to the same WL0 word line 6'. Similarly, each of the cells in a column couples to the same bit lines and the same tunneling line. For example, the first column of cells, including cells C(0,0), C(1,0), . . . , C(m,0), all couple to the BL0 and BL1 bit lines 7-1' and 7-2' and to the TL0 tunneling line 8'.

Figure 2:
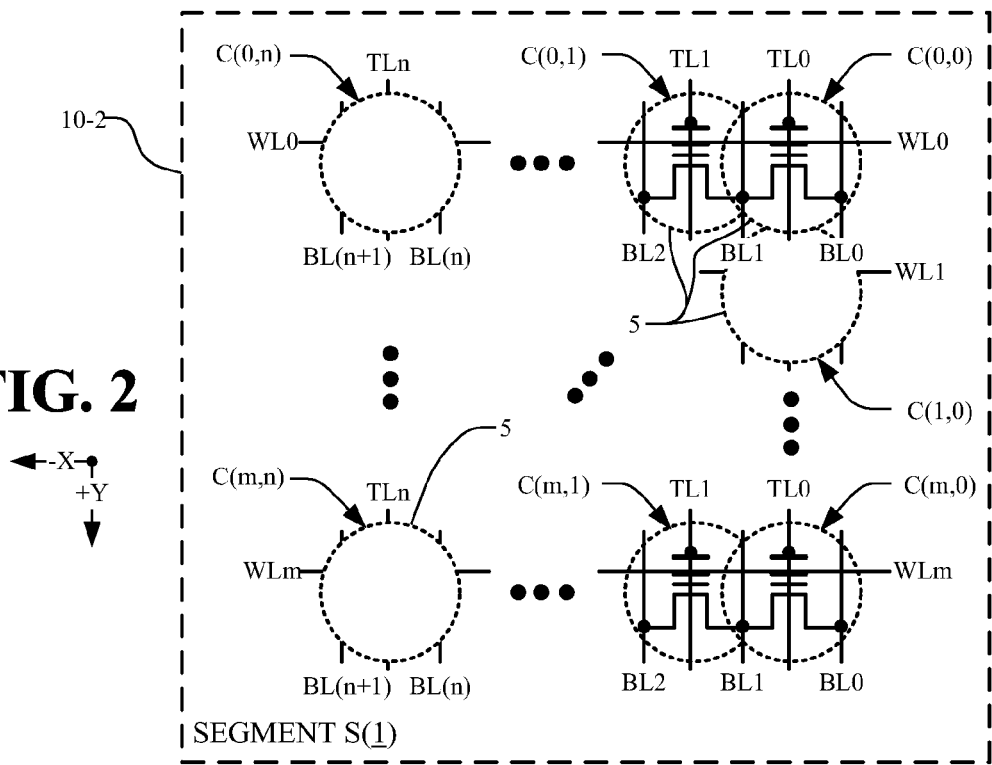
FIG. 2 depicts an (n+1)-by-(m+1) array of cells arranged as a segment having n X-axis cells and m Y-axis cells in a (−x,+y) orientation that mirrors, in the X-axis direction, the (+x,+y) orientation of the FIG. 1 segment.

FIG. 2 depicts an (n+1)-by-(m+1) array of cells arranged as a segment 10-2 having n rows of X-axis cells 5 and m columns of Y-axis cells 5. The rows of cells 5 include cells C(0,n), . . . , C(0,1), C(0,0); cells C(1,n), . . . , C(1,1), C(1,0); and continuing to cells C(m,n), . . . , C(m,1), C(m,0) where not all cells are shown in FIG. 2. The segment 10-2 is defined to have a (x,+y) orientation in that the cell column numbering starts with "n" and decreases in the X-axis direction to "0" and the cell row numbering starts with "0" and increases in the Y-axis direction from 0 to "m". The FIG. 2 segment 10-2 mirrors, in the X-axis direction, the FIG. 1 segment 10-1.

Figure 3:
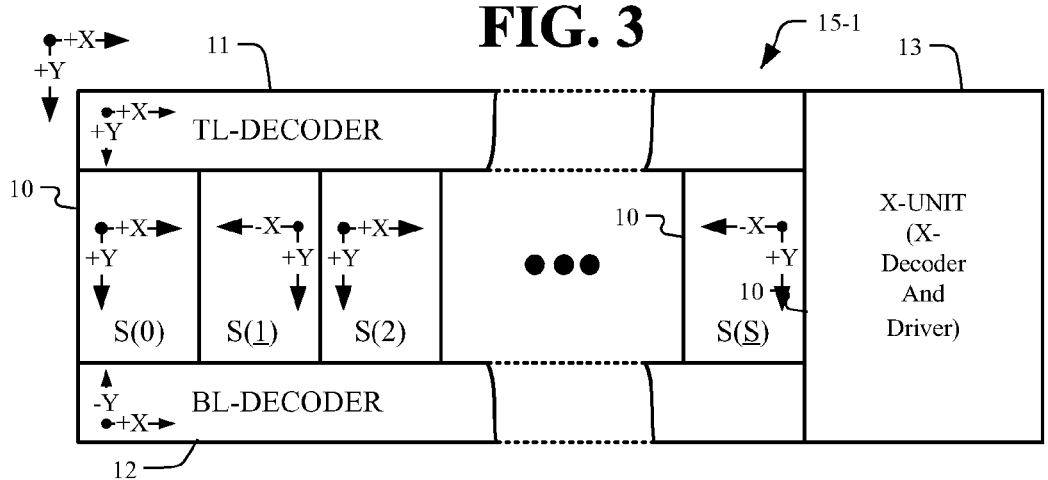
FIG. 3 depicts a first block formed by a plurality of the FIG. 1 and FIG. 2 segments together with a tunneling line (TL) decoder, a bit line (BL) decoder and an X-unit including X-decoders and drivers.

FIG. 3 depicts a first block 15-1 formed by a plurality of the FIG. 1 and FIG. 2 segments 10 together with a tunneling line (TL) decoder 11, a bit line (BL) decoder 12 and an X-unit 13 having X-decoders and drivers for controlling reading and writing of data from and to the segments of the first block 15-1. In the first block 15-1, the tunneling line decoder 11 is defined to have a (+x,+y) orientation in that tunneling line decoder 11 is located toward the Y-axis origin and connects to the segments 10 in the positive Y-axis direction. In the first block 15-1, the bit line decoder 12 is defined to have a (+x,−y) orientation in that bit line decoder 12 is located away from the Y-axis origin and connects to the segments 10 in the negative Y-axis direction.

In FIG. 3, the number of segments 10 is "S" where "S" is an integer and typically an integer equal to a power of 2 such as 2, 4, 8, 16, 32, . . . , $2^n$ where "n" is any positive integer. In particular, the block 15-1 of FIG. 3 includes the segments 10 including segments S(0), S(1), S(2), . . . , S(S). In FIG. 3, the adjacent segments are mirrored in the X-axis direction. The segments S(0) and S(2) have a (+x,+y) orientation while the segments S(1) and S(S) have a (−x,+y) orientation.

Figure 4:
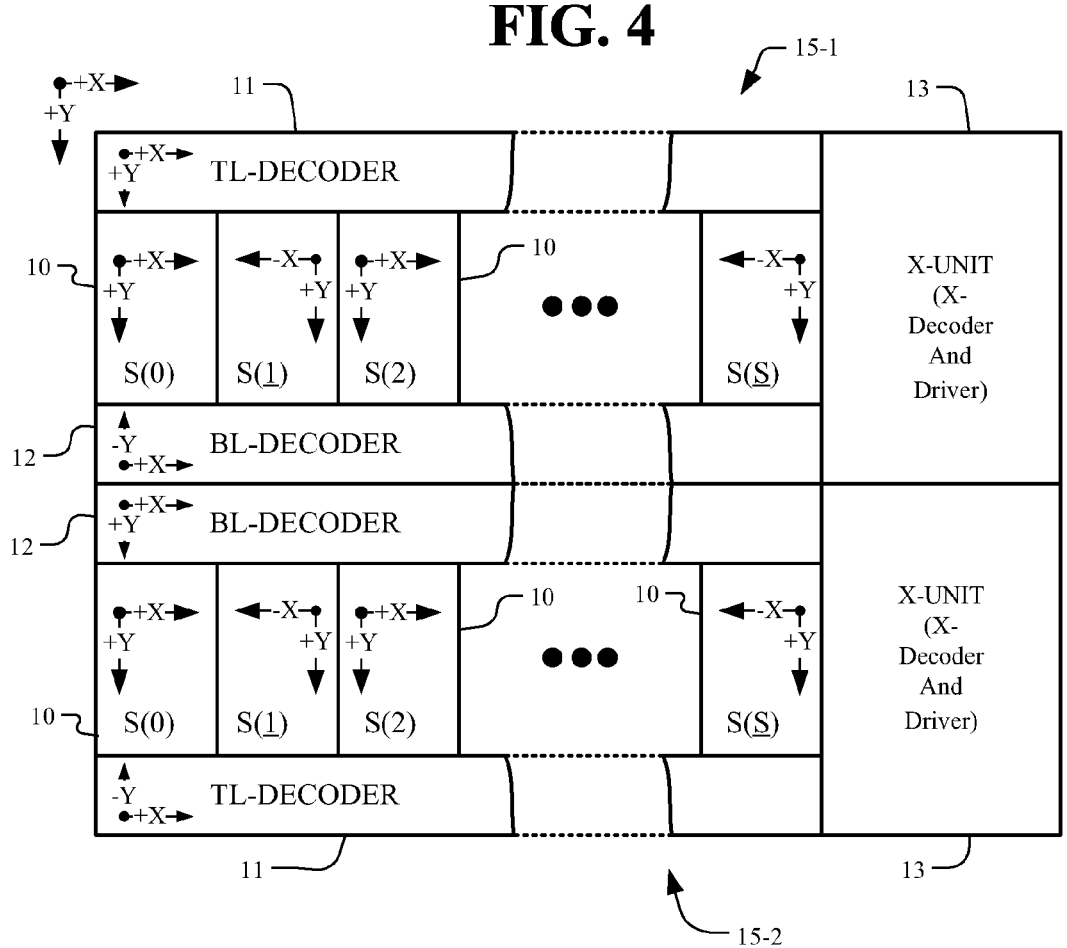
FIG. 4 depicts a first block and a second block where the second block mirrors, in the Y-axis direction, the first block.

FIG. 4 depicts a first block 15-1 formed by a plurality of the FIG. 1 and FIG. 2 segments 10 together with a tunneling line (TL) decoder 11, a bit line (BL) decoder 12 and an X-unit 13 having X-decoders and drivers for controlling accessing of the segments of the first block 15-1. In the first block 15-1, the tunneling line decoder 11 is defined to have a (+x,+y) orientation as described in connection with FIG. 3.

FIG. 4 depicts a second block 15-2 formed by a plurality of the FIG. 1 and FIG. 2 segments 10 together with a tunneling line (TL) decoder 11, a bit line (BL) decoder 12 and an X-unit 13 having X-decoders and drivers for controlling accessing of the segments of the second block 15-2. In the second block 15-2, the tunneling line decoder 11 is defined to have a (+x,−y) orientation in that the tunneling line decoder 11 is located away from the Y-axis origin and connects to the segments 10 in the negative Y-axis direction. In the second block 15-2, the bit line decoder 12 is defined to have a (+x,+y) orientation in that bit line decoder 12 is located toward the Y-axis origin and connects to the segments 10 in the positive Y-axis direction.

In FIG. 4, the second block 15-2, including the second block bit line decoder 12 and tunneling line decoder 11, has an orientation in the Y-axis direction that mirrors the orientation of the first block 15-1, including the first block bit line decoder 12 and tunneling line decoder 11. This mirroring locates the bit line decoder 12 of the first block 15-1 in close proximity to and adjacent the bit line decoder 12 of the second block 15-2 and this close proximity, among other things, permits an efficient layout of the combined block 15-1 and block 15-2 bit line decoder circuitry.

Figure 5:
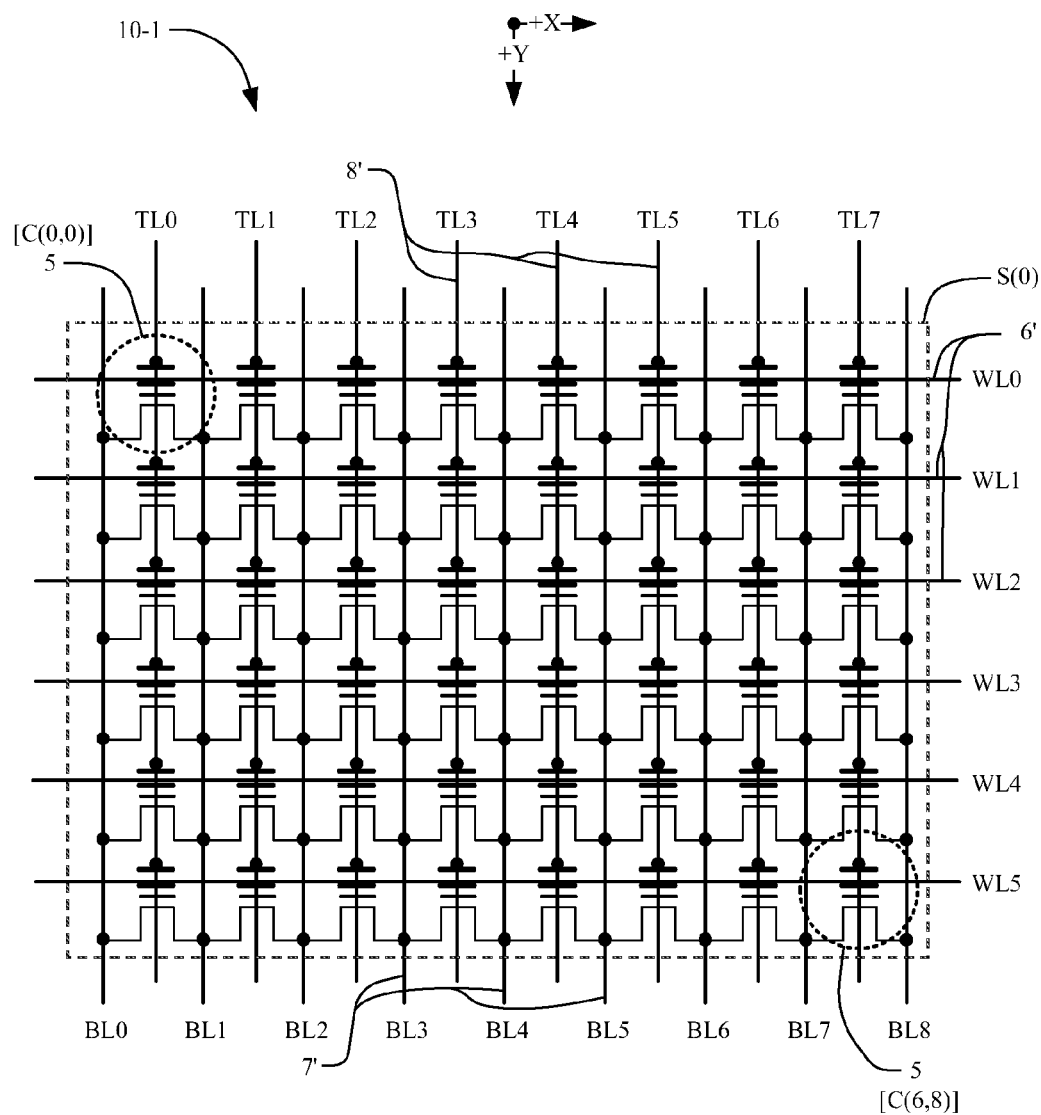
FIG. 5 depicts a segment of the FIG. 1 type formed by eight X-axis rows of cells and six Y-axis columns of cells in a (+x,+y) orientation.

FIG. 5 depicts a segment 10-1 of the FIG. 1 type formed by six X-axis rows of cells 5 and eight Y-axis columns of cells 5 in a (+x,+y) orientation. In FIG. 5, the (n+1)-by-(m+1) array of cells 5 of FIG. 1 has "n+1" equal to 8 and "m+1" equal to 6 whereby the rows of cells 5 according to the FIG. 1 nomenclature includes cells C(0,0), C(0,1), . . . , C(0,7); cells C(1,0), C(1,1), . . . , C(1,7); . . . , and cells C(5,0), C(5,1), . . . , C(5,7) where for clarity in the drawing the cells in FIG. 5 are not all labeled with the FIG. 1 nomenclature.

In FIG. 5, the word lines 6', including word lines WL0, WL1, WL2, WL3, WL4 and WL5, are in the X-axis direction (typically horizontal direction). The bit lines 7', including BL0, BL1, BL2, BL3, BL4, BL5, BL6, BL7 and BL8, are in the Y-axis direction (typically vertical direction). The tunneling lines 8', including TL0, TL1, TL2, TL3, TL4, TL5, TL6 and TL7 are in the Y-axis direction (typically vertical direction).

FIG. 5 provides a schematic drawing for a portion of an array architecture based on cells 5 as described in connection with FIG. 1 where each cell includes a control gate accessed through a word line 6' (WL), a source and a drain accessed through bit lines 7' (BL), a tunneling gate accessed through a tunneling line 8' (TL) and where each cell 5 further includes a charge storage region 9 for storing charges.

Figure 6:
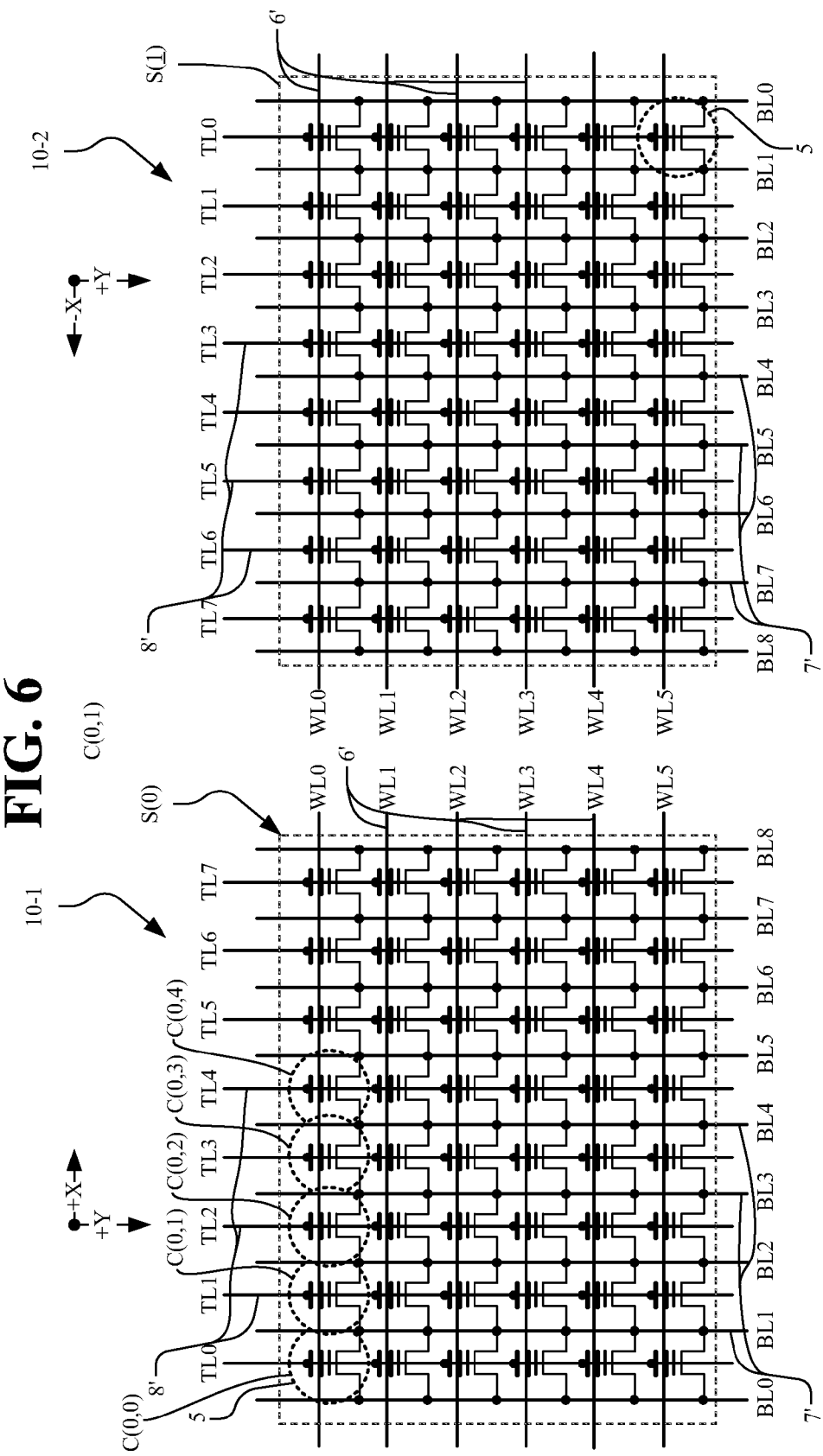
FIG. 6 depicts two segments juxtaposed and mirrored, in the X-axis direction, one segment of the FIG. 1 type with a (+x,+y) orientation and the other segment of the FIG. 2 type with a (−x,+y) orientation.

FIG. 6 depicts two segments 10-1 and 10-2 juxtaposed and mirrored, in the X-axis direction, one segment 10-1 of the FIG. 1 type with a (+x,+y) orientation and the other segment 10-2 of the FIG. 2 type with a mirrored (−x,+y) orientation.

In FIG. 6, the segment 15-1 in the (+x,+y) orientation includes the word lines 6', including word lines WL0, WL1, WL2, WL3, WL4 and WL5, extending in the X-axis direction (typically horizontal direction). The segment 15-1 includes the bit lines 7', including BL0, BL1, BL2, BL3, BL4, BL5, BL6, BL7 and BL8, extending in the Y-axis direction (typically vertical direction). The segment 15-1 includes the tunneling lines 8', including TL0, TL1, TL2, TL3, TL4, TL5, TL6 and TL7 extending in the Y-axis direction (typically vertical direction).

In FIG. 6, the segment 15-2 in the (−x,+y) orientation includes the word lines 6', including word lines WL0, WL1, WL2, WL3, WL4 and WL5, extending in the X-axis direction (typically horizontal direction). The segment 15-2 includes the bit lines 7', including BL8, BL7, BL6, BL5, BL4, BL3, BL2, BL1 and BL0, extending in the Y-axis direction (typically vertical direction). The segment 15-2 includes the tunneling lines 8', including TL7, TL6, TL5, TL4, TL3, TL2, TL1 and TL0, extending in the Y-axis direction (typically vertical direction). The segment 15-2 mirrors, in the X-axis direction, the segment 15-1 whereby the column of cells coupled by word line TL7 in segment 15-1 is adjacent the column of cells coupled by word line TL7 in segment 15-2 whereby the bit line BL8 for segment 15-1 is adjacent and in close proximity to bit line BL8 for segment 15-2.

Figure 7:
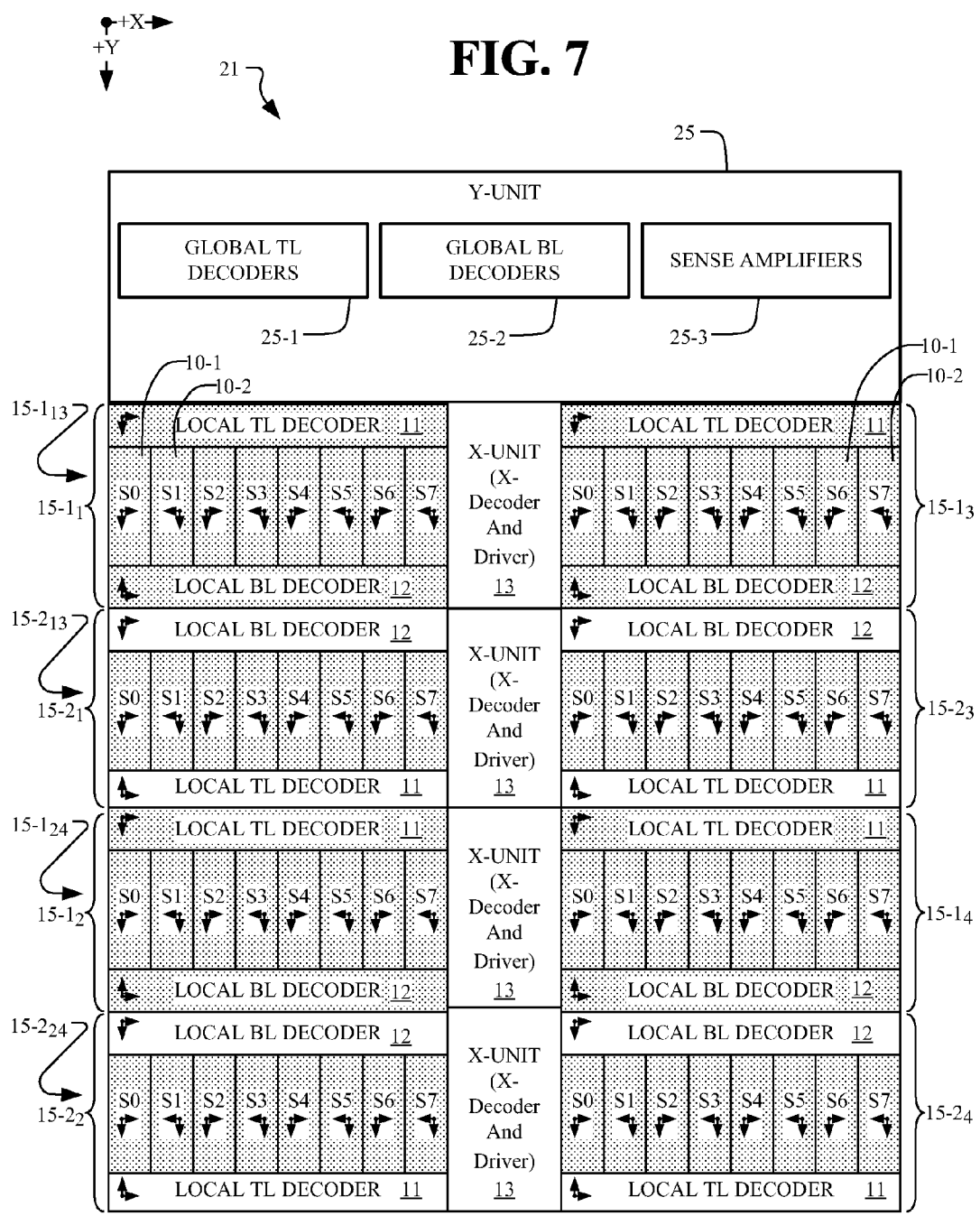
FIG. 7 depicts a memory device with a Y-unit having Y-axis decoders and sense amplifiers, with an X-unit having X-decoders and drivers and with mirrored segments of the FIG. 6 type and with mirrored blocks of the FIG. 4 type.

FIG. 7 provides a top view of one implementation of a memory device 21 having a segmented array architecture. Specifically, FIG. 7 depicts a Y-unit 25 having global TL decoders 25-1, global BL decoders 25-2 and sense amplifiers 25 for accessing array blocks 15. The array blocks 15 include, in one example, the blocks 15-1$_1$, 15-2$_1$, 15-1$_2$ and 15-2$_2$ of the FIG. 3 type. Each block, in one example, is formed with eight segments 10 of the FIG. 1 (10-1) and FIG. 2 (10-2) type with such segments mirrored, in the X-axis direction, like shown in FIG. 6. In the example, alternate blocks, for example blocks 15-1$_1$ and 15-2$_1$ are mirrored, in the Y-axis direction, in the manner shown in FIG. 4.

Also, in FIG. 7, the array blocks 15 include, in the example, blocks 15-1$_3$, 15-2$_3$, 15-1$_4$ and 15-2$_4$ of the FIG. 3 type with each block formed with eight segments 10 of the FIG. 1 (10-1) and FIG. 2 (10-2) type mirrored, in the X-axis direction, like shown in FIG. 6, and with alternate blocks, for example 15-1$_3$ and 15-2$_3$ mirrored, in the Y-axis direction, like shown in FIG. 4.

In the one example described, FIG. 7 depicts two columns of 8-segment blocks including in a first column, the blocks 15-1$_1$, 15-2$_1$, 15-1$_2$ and 15-2$_2$ and including in a second column, the blocks 15-1$_3$, 15-2$_3$, 15-1$_4$ and 15-2$_4$. FIG. 7 can also be configured as a single column of 16-segment blocks by combining pairs of blocks, specifically combining the block pair 15-1$_1$ and 15-1$_3$ (15-1$_{13}$), combining the block pair 15-2$_1$ and 15-2$_3$ (15-2$_{13}$), combining the block pair 15-1$_2$ and 15-1$_4$ (15-1$_{24}$) and combining the block pair 15-2$_2$ and 15-2$_4$ (15-2$_{24}$). In such paired blocks, each one of the pair includes segments S0, S1, S2 S3, S4, S5, S6 and S7 and these segments are re-designated as segments S0, S1, S2 S3, S4, S5, S6, S7, S8, S9, S10, S11, S12, S13, S14 and S15. With such re-designation, FIG. 7 includes four 16-segment blocks 15-1$_{13}$, 15-2$_{13}$, 15-1$_{24}$ and 15-2$_{24}$. With such re-designation, each row of cells 5 in the X-axis direction includes eight cells (eight logical bits) for each segment and therefore has a total of 128 cells (128 logical bits) for a row in the memory device 21.

The memory device 21 of FIG. 7 is arranged with an array architecture in various hierarchy levels, typically including block, row, page, and sector levels. In the FIG. 7 example and also referring to FIG. 6, the array architecture comprises four blocks 15, namely, blocks 15-1$_{13}$, 15-2$_{13}$, 15-1$_{24}$ and 15-2$_{24}$. Each block 15 includes local TL decoders 11 at one Y-axis side of the block and local BL decoders 12 at an opposite Y-axis side of the block. Each block 15 further includes a plurality of word lines 6' (WLs), a plurality of bit lines 7' (BLs), and a plurality of tunneling lines 8' (TLs) as shown in FIG. 6 for two typical segments 10-1 and 10-2. Each word line 6' controls a row of memory cells 5.

The memory device 21 of FIG. 7 is arranged with an array architecture in various hierarchy levels, such as block, row, page, and sector. The memory device of FIG. 7 is typically replicated. For replication in the X-axis direction, the number of cells in a row can be increased from 128 to 256, 512 and other numbers. Referring to FIG. 1 through FIG. 7, each row of cells 5 comprises one or more sectors 10 of memory cells. A sector is defined by the logic bit(s) per cell and the number of sense amplifiers. For example, for a single bit per cell memory and a memory device of 512 sense amplifiers, there are 512 bits for a sector. In the array architecture, a row further comprises a plurality of pages where each page comprises a number of bits generally equal to 2 to the power of an integer n, ($2^n$). A page typically comprises one or more sectors. For example, a page can comprise 8 k ($2^{13}$) bits of data. In one embodiment, the number of sectors per row is defined by the number of cells in the row, the logic bit(s) per cell, and the number of sense amplifiers. For example, for a single bit per cell memory device, a row of 64 k ($2^{16}$) cells with 1 k ($2^{10}$) sense amplifiers, there are 64 sectors in a row with each sector having 1 k ($2^{10}$) bits.

Referring to FIG. 1 through FIG. 7, targeted ones of the cells 5 are accessed for read, write, erase and other functional operations by memory addresses input to the memory device 21 (including replications of device 21 for increasing the number of cells). These memory addresses are then decoded to access the targeted cells for the particular memory functional operation commanded. The segmented architecture memory device 21 permits the concurrent targeting of any one or more cells in any order and in any sequence.

In FIG. 7, memory device 21 includes a Y-unit 25. The Y-unit 25 includes global tunneling line (TL) decoders 25-1, global bit line (BL) decoders 25-2, and sense amplifiers 25-3. The Y-unit 25 is arranged at the top of the device 21. The X-unit 13 (including X-decoders and drivers, as shown in FIG. 3) for each block is located in the middle of the blocks. The local TL decoders 11 and the local BL decoders 12 are arranged from top to bottom and in the middle of the device 21 in the Y-axis direction.

In the embodiment shown in FIG. 7, every two neighboring blocks (in one example, blocks $15\text{-}1_1$ and $15\text{-}2_1$) have mirrored layouts in the Y-axis direction. In the mirrored layout of FIG. 7, the local BL decoder 12 of one block (for example block $15\text{-}1_1$) abuts the local BL decoder 12 of the neighboring block (for example block 15-20. Similar arrangements and considerations are made for the mirroring the local TL decoders 11. In the mirrored layout, the local TL decoder 11 of one block (for example block $15\text{-}2_1$) abuts the local TL decoder 11 of the neighboring block (for example block $15\text{-}1_2$).

In the embodiment shown in FIG. 7, each block 15 comprises a plurality of segments 10. Every two neighboring segments 10 (for example, segments 10-1 and 10-2 in block $15\text{-}1_1$) and their corresponding Y-axis decoders 11 and 12 have mirrored, in the X-axis direction, layout and mirrored logic relationship, as designated by the orthogonal arrows pointing in opposite X-axis directions. For example, the arrows for the segments S0, S2, S4 and S6 of in block $15\text{-}1_1$ all point in a positive X-axis direction indicating a (+x,+y) orientation while the arrows for the segments S1, S3, S5 and S7 in block $15\text{-}1_1$ all point in a negative X-axis direction indicating a mirrored (−x,+y) orientation. Although neighboring designs (such as blocks 15 in the Y-axis direction and segments 10 in the X-axis direction) in FIG. 7 according to one embodiment are arranged in mirrored layout, it should be noted in general that such arrangements and layout need not be mirrored in the segmented memory device 21. Regardless as to whether mirroring is employed, the memory device 21 permits the concurrent targeting of any one or more cells in any order and in any sequence.

Referring to all FIG. 1 through FIG. 7, the device 21 typically includes functional operations of read, of program or of erase. For these functional operations, the terminals of the targeted cells 5 need to be biased (through biasing of the corresponding word lines 6', bit lines 7' and tunneling lines 8') according to the biasing requirements of the particular functional operation desired. For the same functional operations, the terminals of the untargeted cells need to be biased (through biasing of the corresponding word lines 6', bit lines 7' and tunneling lines 8') according to inhibit or unselect requirements of cell operations. The targeted cells for any particular functional operation are usually on the same word line 6' (WL) or in the same block 15, so when operating on one block 15, the word lines 6', the local tunneling lines 8' and local bit lines 7' of the unselected blocks are floated or grounded to save power.

In operation of memory device 21 and referring to FIG. 1 through FIG. 7, the biasing of tunneling lines 8' and bit lines 7' is achieved first by driving global tunneling lines and global bit lines through operation of the Y-unit 25 in response to an input address. The biasing voltages from the Y-unit 25 are then passed to the local tunneling lines 8' and local bit lines 7' through the local TL decoders 11 and local BL decoders 12 of a selected block 15. At the same time, the local TL decoders 11 and local BL decoders 12 of the unselected blocks are separately controlled to float or ground their local tunneling lines 8' and bit lines 7'.

In a typical embodiment for the FIG. 7 memory device 21 and referring to FIG. 1 through FIG. 7, each block 15 has its own X-decoder as part of the X-unit 13 while the drivers for word lines 6' in X-unit 13 can be shared between blocks. With such arrangement and during operations, the word lines 6' of the selected block 15 are driven by the word line drivers through operation of the selected block's X-decoder while the word lines 6' of the unselected blocks are floated or grounded by the separately controlled X-decoders of the unselected blocks. At the end of operations, tunneling lines 8' and bit lines 7' are usually discharged through a Y-decoder in the y-unit 25 and word lines are usually discharged through X-decoders in the X-unit 13.

In embodiments of memory device 21 and referring to FIG. 1 through FIG. 7, decoding is provided for decoding tunneling lines 8' and bit lines 7' according to an array architecture. The array architecture can be a single-level decoding or a multi-level decoding. In the embodiment shown in FIG. 7, a two level decoding architecture is provided. As shown in FIG. 7, the first level is a global level provided by a global decoder in the Y-unit 25. The second level is a local level provided by a local decoder (for example, by the local bit line decoder 12).

Different types of decoding can be employed for both single-level decoding and multi-level decoding. The number of bit lines 7' and tunneling lines 8' that are concurrently biased to select targeted cells in any particular segment during a memory operation is a function of the type of addressing and decoding employed. Examples of addressing and decoding that are employed include binary decoding and thermometer decoding. The thermometer decoding is described in the above-identified cross-referenced application entitled BIT LINE DECODER ARCHITECTURE FOR NOR-TYPE MEMORY ARRAY. Typically, hierarchical binary decoding is used for word line (WL) decoding.

The mirrored configuration of local bit line and tunneling line decoders employed in the FIG. 7 architecture, as described in connection with FIG. 4, provides the advantage of ensuring an efficient layout and permits the overlapping of two regions with the same function. Specifically and by way of example, the bit line decoder 12 region of a block $15\text{-}1_1$ abuts and is juxtaposed the bit line decoder 12 region of a block $15\text{-}2_1$. These abutting bit line decoder 12 regions permit sharing between the regions so that routing efficiency can be maximized and the overall layout area for the combined two regions can be minimized.

The mirrored configuration of block segments 10 in the FIG. 7 architecture, as described in connection with FIG. 1, FIG. 2, FIG. 3 and FIG. 6, is beneficial to array operations of the memory device 21. During array operations, if the bit lines 7' or the tunneling lines 8' are biased in each segment, such as adjacent segments 10-1 and 10-2, and the bias is not uniform within the segment, then the mirrored configuration ensures minimum leakage between segments. Minimum leakage between segments occurs since at the boundary between every two mirrored segments, the bias is always the same. Referring to FIG. 6 by way of example, in the region near the interface between segment 10-1 and the mirrored segment 10-2, a bit line BL8 appears in both segment 10-1 and in segment 10-2. Since the same BL8 appears in the region near the interface, each bit line BL8 will have the same bias and hence the leakage will be at a minimum. Similarly, in the region near the interface between segment 10-1 and the mirrored segment 10-2, a tunneling line TL7 appears in both segment 10-1 and in segment 10-2. Since the same TL7 tunneling line appears in the region near the interface, each tunneling line TL7 will have the same bias and hence the leakage will be at a minimum.

The mirrored configuration of block segments 10 in the FIG. 7 architecture, as described in connection with FIG. 1, FIG. 2, FIG. 3 and FIG. 6, is additionally beneficial to array operations of the memory device 21 because of reduced transients. The mirrored segment configuration ensures minimum transient capacitance that bit lines or tunneling lines see at the boundary because the effective transient capacitance between two nodes (for example between BL8 in segment 10-1 and BL8 in segment 10-2) with the same bias is zero. This zero bias results in smaller effective RC values for the bit lines and the tunneling lines at the segment boundaries. Smaller effective RC values tend to permit faster array operations.

The array architecture of the present specification further provides various erase features for memory operations. Such features include block erase, row erase, sector erase, and partial sector erase. The block erase and row erase provide erase operations over a block and a row of memory cells, respectively. Similarly, the sector erase and partial sector erase provide erase operations over a full sector and a partial sector of memory cells, respectively. During such erase operations, the selection on a block, a row, a sector, or a partial sector from the rest of memory array is made typically through addressing and decoding that achieves the desired functional operation. All of these different functional operations are possible because the segmented array architecture permits concurrent targeting of any one or more cells in the memory device 21. Such erase operation features provide the advantages of more flexible and greater alterability in erasing cells.

A novel array architecture is provided in the present specification. The array architecture can be applied at any array level including row, sector or page or any other memory allocation.

Figure 8:
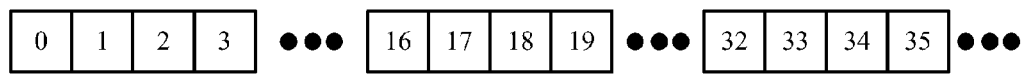
FIG. 8 depicts addresses and physical cell locations arranged in a linear pattern.

FIG. 8 shows a top view of a linear array architecture. The array architecture of FIG. 8 uses conventional linear addressing and decoding. As an example, a row of size R+1 is assumed to include R+1 memory cells (such as cells 5 in FIG. 6) such cells designated as C(r,0), C(r,1), C(r,2), ..., C(r,R) for any row "r" of R+1 cells. In FIG. 8, the targeting of the physical cells C(r,0), C(r,1), C(r,2), ..., C(r,R) in row "r" is a one-to-one mapping of the linear addresses 0, 1, 2, 3, ..., 16, 17, 18, 19, ..., 32, 33, 34, 35, ..., R. The actual cells targeted and the physical cells accessed in a row "r" of cells (such as cells 5 in FIG. 6 and replications thereof) by the linear addresses 0, 1, 2, 3, ..., 16, 17, 18, 19, ..., 32, 33, 34, 35, ..., R is therefore the physically adjacent cells C(r,0), C(r,1), C(r,2), ..., C(r,16), C(r,17), C(r,18), ..., C(r,32), C(r,33), C(r,34), ..., C(r,R). In FIG. 8, the sequence of consecutive addresses is in a linear order and results in targeting of cells 5 in a linear order of physical cell locations. When a NAND flash memory device is used for solid state disk products, the linear order architecture of FIG. 8 is a commonly used architecture to reflect the decoding scheme in NAND. However, this type of linear architecture of FIG. 8 is believed to suffer from error bits introduced by defects during manufacturing of the memory device or by bit failure during memory device operation. In some situations, such problems can result in damage unrepairable by conventional means (e.g. error-coded-correction ECC). For example, when a defect has a size large enough to damage several consecutive physical cell locations, frequently a whole sector of cell addresses cannot be used and has to be mapped out to be excluded from use by the memory device. In some cases, information stored in a whole sector can be un-retrievable.

Figure 9:
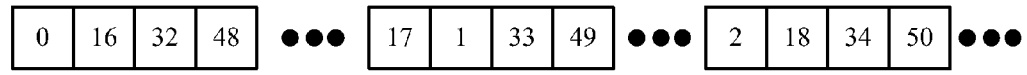
FIG. 9 depicts addresses and physical cell locations arranged in an interleaved pattern.

FIG. 9 provides, as one example, a non-linear addressing architecture of this specification that avoids the problems described in connection with the linear architecture of FIG. 8. The addresses of the interleave architecture in FIG. 9 are not arranged in the linear order of FIG. 8. Instead, in FIG. 9, consecutive addresses are arranged in a non-linear interleave order wherein an interval of addresses is inserted regularly between two consecutive addresses. The interleave interval in FIG. 9 is shown by way of example with a value of 16. The interleave interval can be any value and typically is a power of 2 such as 4, 8, 32, 64, 128, 256 and so on. The interleave interval can be but need not be related to the sector size or to any other particular block, row, page or other size.

The advantage for the non-linear architecture provided in FIG. 9 is that in the situation where there is a defected area in physical cells that are adjacent to each other, the resulting number of error bits per sector and their impact on the sector are significantly minimized. As an example, it is assumed that a defect affects a number of adjacent physical address locations such a the four cell 5 locations C(0,0), C(0,1), C(0,2), C(0,3) of segment 10-1 in FIG. 6. The resulting impact by such a group of four defective physical addresses on the sector architecture of FIG. 8 is that there are four error bits in one sector. Specifically, the consecutive FIG. 8 addresses 0, 1, 2, 3, 4, 5 and so on will result in four errors for addresses 0, 1, 2, 3 as the result of the defective cells C(0,0), C(0,1), C(0,2), C(0,3).

The number of error bits and their impact on a single sector are greatly reduced in the sector architecture of FIG. 9 because consecutive addresses do not access adjacent physical cells in the memory device. In one example, the defective physical cell locations C(0,0), C(0,1), C(0,2), C(0,3) of FIG. 6 might correspond to interleaved addresses 0, 16, 32, 48. That is, in the example assumed, address 0 accesses physical cell C(0,0); address 1 accesses physical cell C(0,16),; address 2 accesses physical cell C(0,32); and address 3 accesses physical cell C(0,48) and so. Accordingly, when consecutive addresses 0, 1, 2 and 3 are presented to target cells in the memory with the FIG. 9 array architecture, only the defective cell C(0,0) results in an error and the target cells for the addresses 1, 2, and 3 do not target the defective cells C(0,1), C(0,2), C(0,3). In the example assumed, the addresses 1, 2, and 3 target other cells in different sectors. The example described contains only one defective cell, cell C(0,0), and one defective address therefor (thus one error bit) for the address sequence 0, 1, 2, 3. The non-linear architecture in FIG. 9 permits a more effective way of utilizing ECC for handling defective error bits.

The interleave address architecture in FIG. 9 can be employed on a sector level and can be applied to any level within the array hierarchy (such as row or page) as long as the interleave address architecture can effectively spread error bits in the array hierarchy to avoid errors concentrated at one level. Further, in an array hierarchy, typically it requires at least one level having an address architecture not in the linear order (i.e. in a non-linear order) to achieve the error-bit spreading. Such non-linear order addressing scheme is shown in FIG. 9 in the form of the interleave address architecture, and can be in general in any other types of form having the non-linear addressing scheme that can effectively spread error bits in an array hierarchy to avoid errors concentrated at one level.

Figure 10:
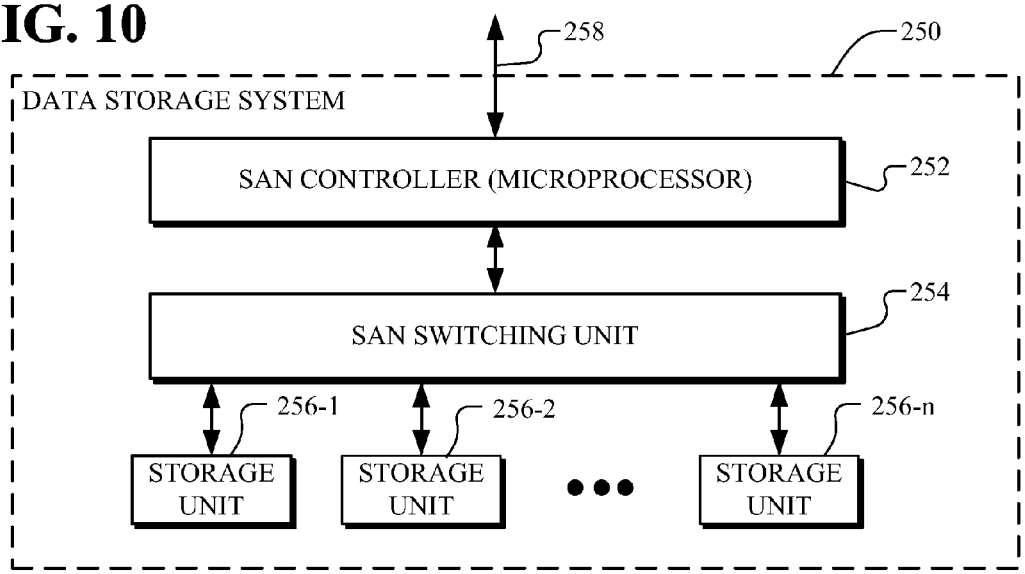
FIG. 10 is a functional block diagram of a data storage system having storage units with memory devices of the type described in the present specification.

Referring now to FIG. 10, the teachings of the present disclosure are extended to storage products including data storage systems and solid-state disks. In FIG. 10, a data storage system 250 comprises a storage area network (SAN) controller 252, a SAN switching unit 254, and storage units 256-1, 256-2, . . . , and 256-*n* (collectively storage units 256). The SAN controller 252 may comprise a microprocessor that interfaces with an external device (e.g., a host, not shown) through an input/output (I/O) bus 258. The I/O bus 258 may be based on fiber-channels or Ethernet that provide high speed and wide bandwidth for data transmission. Typically, the transmission speed may range from about a few gigabits per second (Gb/s) to speeds faster than 10 Gb/s. Additionally, the SAN controller 252 typically controls the SAN switching unit 254. The SAN switching unit 254 typically includes a plurality of switches. Each of the switches may interface with one of the storage units 256 and may be controlled by the SAN controller 252. The storage units 256 typically stores information that includes audio data, video data, and/or any other type of data in a digital format.

Figure 11:
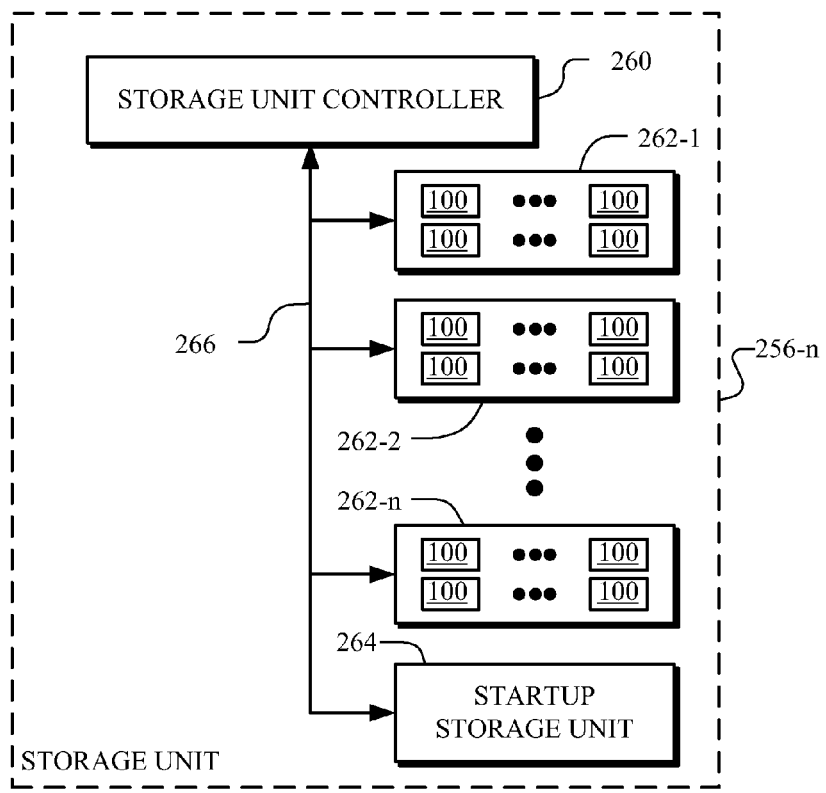
FIG. 11 is a functional block diagram of a storage unit of the data storage system of FIG. 10.

In FIG. 11, one of the storage units 256 (e.g., the storage unit 256-*n*) comprises a storage unit controller 260, solid-state drives (SSD) 262-1, 262-2, . . . , 262-*n* (collectively SSDs 262), a startup storage unit 264, and a bus 266. Each of the SSDs 262 typically comprises one or more memory ICs 100. Additionally, each of the SSDs 262 typically comprises a memory controller (not shown) that controls the one of more of the memory ICs 100. The startup storage unit 264 typically includes code for operating the storage unit controller 260. Using the code, the storage unit controller 260 typically controls the SSDs 262 via the bus 266.

While the invention has been particularly shown and described with reference to preferred embodiments thereof it will be understood by those skilled in the art that various changes in form and details typically is made therein without departing from the scope of the invention.

What is claimed is:

1. A memory device comprising:
a plurality of nonvolatile memory cells arrayed in a first direction and in a second direction;
a plurality of first lines extending in the first direction for coupling nonvolatile memory cells arrayed in the first direction;
a plurality of second lines extending in the second direction for coupling nonvolatile memory cells arrayed in the second direction; and
a plurality of decoders, including i) first decoders coupled to the first lines and ii) second decoders coupled to the second lines, for accessing any one or more of the nonvolatile memory cells in any order,
wherein the memory device includes a plurality of segments,
wherein each segment includes different ones of the nonvolatile memory cells,
wherein a first one of the segments is juxtaposed to, in the second direction, a second one of the segments, and
wherein the second one of the segments mirrors, in the second direction, the first one of the segments.

2. The memory device of claim 1, wherein the order of accessing nonvolatile memory cells is interleaved with an interleave interval.

3. The memory device of claim 2, wherein the interleave interval is $2^n$ where n is a positive integer.

4. The memory device of claim 2, wherein the nonvolatile memory cells are organized in sectors having a sector size and the interleave interval is equal to or greater than the sector size.

5. The memory device of claim 1, wherein the order of accessing nonvolatile memory cells is non-linear.

6. A memory device comprising:
a plurality of nonvolatile memory cells arrays in a first direction and in a second direction;
a plurality of first lines extending in the first direction for coupling nonvolatile memory cells arrays in the first direction;
a plurality of second lines extending in the second direction for coupling nonvolatile memory cells arrayed in the second direction; and
a plurality of decoders, including i) first decoders coupled to the first lines and ii) second decoders coupled to the second lines, for accessing any one or more of the nonvolatile memory cells in any order,
wherein the memory device includes a plurality of segments,
wherein each segment includes different ones of the nonvolatile memory cells,
wherein a first one of the segments is juxtaposed to, in the second direction, a second one of the segments,
wherein a first group of the plurality of segments is in a first block with first ones of the first decoders on a first side of the first block,
wherein a second group of the plurality of segments is in a second block with second ones of the first decoders on a second side of the second block, and
wherein the first group is juxtaposed to the second group with the second group mirroring, in the first direction, the first group whereby the first ones of the first decoders are adjacent the second ones of the first decoders.

7. The memory device of claim 1, wherein the first lines include bit lines and the first decoders include bit line decoders and wherein the second lines include word lines and the second decoders include word line decoders.

8. The memory device of claim 7, wherein the first lines include tunneling lines and the first decoders include tunneling line decoders.

9. The memory device of claim 1, wherein functional operations of the memory device target concurrently any one or more nonvolatile memory cells.

10. The memory device of claim 9, wherein the nonvolatile memory cells are organized in blocks, rows and sectors and the functional operations include one or more of block erase, row erase, and sector erase.

11. The memory device of claim 9, wherein the functional operations include erase all for erasing all of the nonvolatile memory cells and erase partial for erasing some of the nonvolatile memory cells.

12. The memory device of claim 9, wherein the functional operations target concurrently any one or more groups of nonvolatile memory cells.

13. The memory device of claim 9, wherein the functional operations target any one or more nonvolatile memory cells.

14. The memory device of claim 1, wherein the nonvolatile memory cells are organized in architectural levels including one or more of blocks, sectors, rows and pages.

15. A memory device comprising:
a plurality of segments, each segment including,
a plurality of nonvolatile memory cells arrayed in a first direction and in a second direction, one or more bit lines extending in the first direction for coupling nonvolatile memory cells arrayed in the first direction,
one or more word lines extending in the second direction for coupling nonvolatile memory cells arrayed in the second direction; and
a plurality of blocks, each block including,
a group of the plurality of segments, wherein first ones of the segments are juxtaposed to, in the second direction, second ones of the segments,
a plurality of decoders, including i) bit line decoders coupled to the bit lines and ii) word line decoders coupled to the word lines, for accessing any one or more of the nonvolatile memory cells in any order,
wherein the second ones of the segments mirror, in the first direction, the first ones of the segments.

16. The memory device of claim 15, wherein:
a first block has first-block bit line decoders on a side of the first block,
a second block has second-block bit line decoders on a side of the second block,
and wherein the first block is juxtaposed to, in the first direction, the second block with the second block mirroring, in the first direction, the first block whereby the first-block bit line decoders are adjacent the second-block bit line decoders.

17. The memory device of claim 15, wherein the order of accessing nonvolatile memory cells is interleaved with an interleave interval.

18. The memory device of claim 17, wherein the interleave interval is $2^n$ where n is a positive integer.

19. The memory device of claim 15, wherein functional operations of the memory device target concurrently any one or more nonvolatile memory cells.

20. A memory device comprising:
a plurality of segments, each segment including,
a plurality of nonvolatile memory cells arrayed in a first direction and in a second direction,
one or more first bit lines extending in the first direction for coupling nonvolatile memory cells arrayed in the first direction,
one or more second bit lines extending in the first direction for coupling nonvolatile memory cells arrayed in the first direction,
one or more tunneling lines extending in the first direction for coupling nonvolatile memory cells arrayed in the first direction,
one or more word lines extending in the second direction for coupling nonvolatile memory cells arrayed in the second direction; and
a plurality of blocks, each block including,
a group of the plurality of segments, wherein first ones of the segments in the group are juxtaposed to, in the second direction, second ones of the segments,
a plurality of decoders, including i) bit line decoders coupled to the bit lines and ii) word line decoders coupled to the word lines, for accessing any one or more of the nonvolatile memory cells in any order,
wherein the second ones of the segments mirror, in the first direction, the first ones of the segments.

21. The memory device of claim 20, wherein:
a first block has first-block bit line decoders on a side of the first block,
a second block has second-block bit line decoders on a side of the second block,
and wherein the first block is juxtaposed to, in the first direction, the second block with the second block mirroring, in the first direction, the first block whereby the first-block bit line decoders are adjacent the second-block bit line decoders.

22. A memory device comprising,
a plurality of segments, each segment including,
a plurality of memory cells arrayed in a first direction and in a second direction where each memory cell includes,
a first element, a second element and a channel between the first element and the second element in a body,
a charge storage region juxtaposed to the channel,
a control gate juxtaposed to the charge storage region,
a tunneling gate juxtaposed to the control gate,
one or more first lines extending in the first direction for coupling the first element in a first group of the memory cells arrayed in the first direction,
one or more second bit lines extending in the first direction for coupling the second element in the first group of the memory cells arrayed in the first direction,
one or more tunneling lines coupling the tunneling gate in the first group of the memory cells arrayed in the first direction,
one or more word lines extending in the second direction, for coupling the plurality of the memory cells arrayed in the second direction, and juxtaposed to the charge storage regions for a plurality of the memory cells extending in the second direction,
wherein a first one of the segments is juxtaposed to a second one of the segments in the second direction and wherein the segments have a first side in the first direction and have an opposite side in the first direction; and
a plurality of blocks, each block including,
a group of the plurality of segments, wherein first ones of the segments in the group are juxtaposed to, in the second direction, second ones of the segments and the second ones of the segments mirror, in the first direction, the first ones of the segments,
a plurality of decoders, including i) bit line decoders coupled to the bit lines and ii) word line decoders coupled to the word lines, for accessing any one or more of the memory cells in any order,
a first block of the plurality of blocks having first-block bit line decoders on a side of the first block,
a second block of the plurality of blocks having second-block bit line decoders on a side of the second block,
and wherein the first block is juxtaposed to, in the first direction, the second block with the second block mirroring, in the first direction, the first block whereby the first-block bit line decoders are adjacent the second-block bit line decoders.

* * * * *